United States Patent
Yu

(10) Patent No.: US 11,544,836 B2
(45) Date of Patent: Jan. 3, 2023

(54) GRID CLUSTERING-BASED SYSTEM FOR LOCATING AN ABNORMAL AREA OF SOLDER PASTE PRINTING AND METHOD THEREOF

(71) Applicants: Inventec (Pudong) Technology Corporation, Shanghai (CN); Inventec Corporation, Taipei (TW)

(72) Inventor: Li Yu, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 135 days.

(21) Appl. No.: 17/205,576

(22) Filed: Mar. 18, 2021

(65) Prior Publication Data

US 2022/0301146 A1 Sep. 22, 2022

(51) Int. Cl.
*G06K 9/00* (2022.01)
*G06T 7/00* (2017.01)
*H05K 3/12* (2006.01)

(52) U.S. Cl.
CPC ............ *G06T 7/0004* (2013.01); *H05K 3/12* (2013.01); *G06T 2207/20021* (2013.01); *G06T 2207/30141* (2013.01); *G06T 2207/30144* (2013.01); *G06T 2207/30152* (2013.01); *H05K 2203/163* (2013.01)

(58) Field of Classification Search
CPC ......... G06T 7/0004; G06T 2207/20021; G06T 2207/30141; G06T 2207/30144; G06T 2207/30152; H05K 3/12; H05K 2203/163
See application file for complete search history.

(56) References Cited

U.S. PATENT DOCUMENTS

| | | | | |
|---|---|---|---|---|
| 5,949,905 | A * | 9/1999 | Nichani | G06V 10/28 382/172 |
| 6,317,513 | B2 * | 11/2001 | Michael | H05K 3/3485 382/145 |
| 6,463,426 | B1 * | 10/2002 | Lipson | G06F 16/5838 707/E17.02 |
| 11,452,250 | B2 * | 9/2022 | Futamura | H05K 3/3494 |
| 2002/0015780 | A1 * | 2/2002 | Holm | B23K 3/0607 427/282 |
| 2011/0103678 | A1 * | 5/2011 | Wang | G06T 7/001 382/150 |
| 2018/0114304 | A1 * | 4/2018 | Chen | G06T 7/001 |
| 2022/0012917 | A1 * | 1/2022 | Kelly | H05K 13/082 |
| 2022/0215521 | A1 * | 7/2022 | Lee | G01N 21/95 |

* cited by examiner

*Primary Examiner* — Shervin K Nakhjavan
(74) *Attorney, Agent, or Firm* — David R. Stevens; Stevens Law Group

(57) ABSTRACT

A grid clustering-based system for locating abnormal area of solder paste printing and a method thereof are disclosed. In the system, an analysis device divides circuit board size information to generate divided grids based on grid size information, when a total number of at least one bad solder joint of one of the divided grids is determined to be higher than or equal to a density threshold value, the analysis device sets the one of divided grids as a high dense grid, the analysis device then integrates the divided grids, which are high dense grids and interconnected to each other, as a high-dense bad solder joint area. Therefore, the technical effect of integrating high dense areas of bad solder joint to locate the bad solder joint can be achieved.

10 Claims, 5 Drawing Sheets

FIG. 3

GRID CLUSTERING-BASED SYSTEM FOR LOCATING AN ABNORMAL AREA OF SOLDER PASTE PRINTING AND METHOD THEREOF

BACKGROUND OF THE INVENTION

1. Field of the Invention

The present invention is related to an area locating system and a method thereof, and more particularly to a grid clustering-based system for locating an abnormal area of solder paste printing and a method thereof.

2. Description of the Related Art

Solder paste printing is a key process in the production process of surface mount technology. Generally, the quality of printed products is mainly evaluated according to statistical program control with statistical process control tools, and this approach can determine whether the process capability meets the standard. However, the conventional solder paste printing inspection is performed based on control charts only and is unable to diagnose abnormal case, that is, the conventional solder paste printing inspection is unable to find the area where bad solder joints occur densely.

In the conventional solder paste printing inspection for products with unqualified solder paste printing, only the location information of the bad solder joints and other inspection information can be obtained from the inspection apparatus, and the inspection apparatus is unable to provide information of the defective areas.

Therefore, what is needed is to develop an improved technical solution to solve the conventional technical problem that the conventional inspection for bad solder joint on circuit board inspects bad solder joints only and is unable to integrally analyze area of bad solder joints.

SUMMARY OF THE INVENTION

An objective of the present invention is to disclose a grid clustering-based system for locating an abnormal area of solder paste printing and a method thereof, so as to solve the technical problem that the conventional inspection for bad solder joint on circuit board inspects bad solder joint only and is unable to integrally analyze area of bad solder joints In order to achieve the objective, the present invention provides a grid clustering-based system for locating abnormal area of solder paste printing, and the grid clustering-based system includes an analysis device. The analysis device includes a receiving module, a grid generating module, a grid designating module, a bad solder joint statistics module, a grid setting module, and an area integrating module.

The receiving module is configured to receive circuit board size information of a circuit board to be inspected and location information of at least one bad solder joint from a solder paste inspection apparatus. The grid generating module is configured to divide the circuit board size information to generate a plurality of divided grids based on the grid size information. The grid designating module is configured to designate the location information of at least one bad solder joint as belonging to one of the plurality of generated divided grids. The bad solder joint statistics module is configured to compile statistics of a total number of the at least one bad solder joint belonged to each of the plurality of divided grids. When the total number of the at least one bad solder joints of one of the plurality of divided grids is determined to be higher than or equal to a density threshold value, the grid setting module sets the one of the plurality of divided grids as a high dense grid. The area integrating module is configured to determine whether any one of the divided grids adjacent to the high dense grid is a high dense grid, integrate the adjacent high dense grids as at least one high-dense bad solder joint area based on a minimum description length principle, so as to find all high dense areas of bad solder joints.

In order to achieve the objective, the present invention provides a grid clustering-based method for locating abnormal area of solder paste printing, and the grid clustering-based method includes steps of: using an analysis device to receive circuit board size information of a circuit board to be inspected and location information of at least one bad solder joint from a solder paste inspection apparatus; using the analysis device to divide the circuit board size information to generate a plurality of divided grids based on grid size information: using the analysis device to designate the location information of at least one bad solder joint as belonging to one of the plurality of generated divided grids; using the analysis device to compile statistics of a total number of at least one bad solder joint belonged to each of the plurality of divided grids; when the total number of at least one bad solder joint of one of the plurality of divided grids is determined to be higher than or equal to a density threshold value, using the analysis device to set the one of plurality of divided grids as a high dense grid; and using the analysis device to determine whether any one of divided grids adjacent to the high dense grid is a high dense grid, and integrate the adjacent high dense grids as at least one high-dense bad solder joint area based on minimum description length principle, so as to find all high dense areas of bad solder joints.

According to above-mentioned contents, the difference between the system and method of the present invention and the conventional technology is that the analysis device divides the circuit board size information to generate the divided grids based on the grid size information, and w % ben the total number of bad solder joints of one of the divided grids is determined to be higher than or equal to the density threshold value, the analysis device sets the one of the divided grids as a high dense grid, and then integrates the divided grids, which are high dense grids and interconnected to each other, as a high-dense bad solder joint areas, so as to provide the quick and intuitive effect of locating the bad solder joints.

According to aforementioned technical solution, the present invention can achieve the technical effect of integrating high dense areas of bad solder joint to locate the bad solder joint.

BRIEF DESCRIPTION OF THE DRAWINGS

The structure, operating principle and effects of the present invention will be described in detail by way of various embodiments which are illustrated in the accompanying drawings.

FIG. 3 is a schematic view of high dense grids generated by a grid clustering-based system for locating an abnormal area of solder paste printing, according to the present invention.

DETAILED DESCRIPTION OF THE PREFERRED EMBODIMENTS

Figure 1:
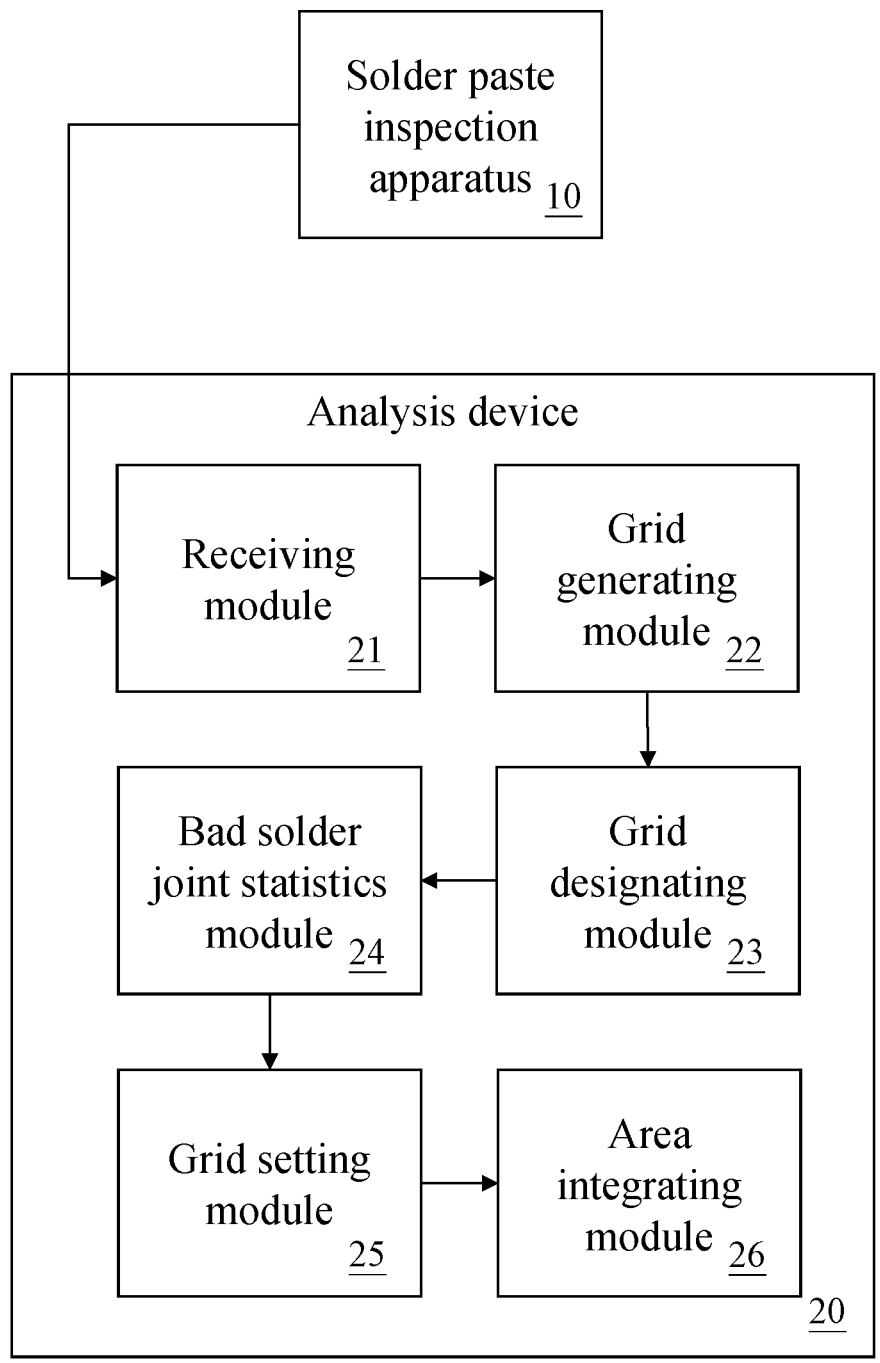
FIG. 1 is a system block diagram of a grid clustering-based system for locating an abnormal area of solder paste printing, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The implementation of the present invention will be illustrated in detail with reference to the accompanying drawings and embodiment, so that the implementation process of applying the technical solution of the present invention to solve technical problem and achieve technical effect will be readily apparent as the same becomes better understood for implementation.

The grid clustering-based system for locating an abnormal area of solder paste printing of the present invention will be described in following paragraphs. Please refer to FIG. 1, which is a system block diagram of a grid clustering-based system for locating an abnormal area of solder paste printing, according to the present invention.

The grid clustering-based system for locating an abnormal area of solder paste printing includes a solder paste inspection apparatus 10 and an analysis device 20, and the analysis device 20 includes a receiving module 21, a grid generating module 22, a grid designating module 23, a bad solder joint statistics module 24, a grid setting module 25, and an area integrating module 26.

Solder paste is printed on particular locations on a circuit board in a solder paste printing machine, and the solder paste inspection apparatus 10 then performs real-time inspection on the circuit board, which is printed with solder paste, to inspect location information of at least one bad solder joint on the circuit board. When performing the real-time inspection on the circuit board, the solder paste inspection apparatus 10 imports basic information of the circuit board first, the basic information includes circuit board size information of the circuit board. In an embodiment, the solder paste inspection apparatus 10 can pre-store the basic information of the circuit board, and when the solder paste inspection apparatus 10 performs inspection on the circuit board, the solder paste inspection apparatus 10 imports the basic information of the to-be-inspected circuit board to obtain the circuit board size information of the to-be-inspected circuit board; in an embodiment, when the solder paste inspection apparatus 10 performs real-time inspection to the circuit board, the solder paste inspection apparatus 10 can obtain the circuit board size information of the circuit board by an image recognition manner; however, these examples are merely for exemplary illustration, and application field of the present invention is not limited thereto.

The analysis device 20 and the solder paste inspection apparatus 10 can be interconnected through a wired transmission manner or a wireless transmission manner; for example, the wired transmission manner can be a power line network, and an optical network and so on; and the wireless transmission manner can be Wi-Fi, mobile communication network such as 3G, 4G, 5G and so on; however, these examples are merely for exemplary illustration, and the application field of the present invention not limited thereto.

The receiving module 21 of the analysis device 20 can receive the circuit board size information of circuit board to be inspected and the location information of at least one bad solder joint from the solder paste inspection apparatus 10; particularly, the circuit board size information of the circuit board can be, for example, 675×625, 550×350, and so on; the location information of the bad solder joint can be information of coordinate point, such as (123,456), (343, 543), and so on. These examples are merely for exemplary illustration, and application field of the present invention is not limited thereto.

The grid generating module 22 of the analysis device 20 divides the circuit board size information to generate a plurality of divided grids based on grid size information. In an embodiment, when the grid size information is, for example, 50×50 and it indicates that the grid has a size of 50×50; when the grid size information is, for example, 100×50, it indicates that the grid has a size of 100×50; when the grid size information is, for example, 50×100, it indicates that the grid has a size of 50×100. These examples are merely for exemplary illustration, and application field of the present invention is not limited thereto. According to aforementioned example, the grid size information can have length dimension and width dimension with the same values or different values. In an embodiment, the analysis device 20 can be preset with the grid size information, or the analysis device 20 can receive the grid size information from an external device by wired transmission manner or wireless transmission manner. These examples are merely for exemplary illustration, and application field of the present invention is not limited thereto.

Figure 2:
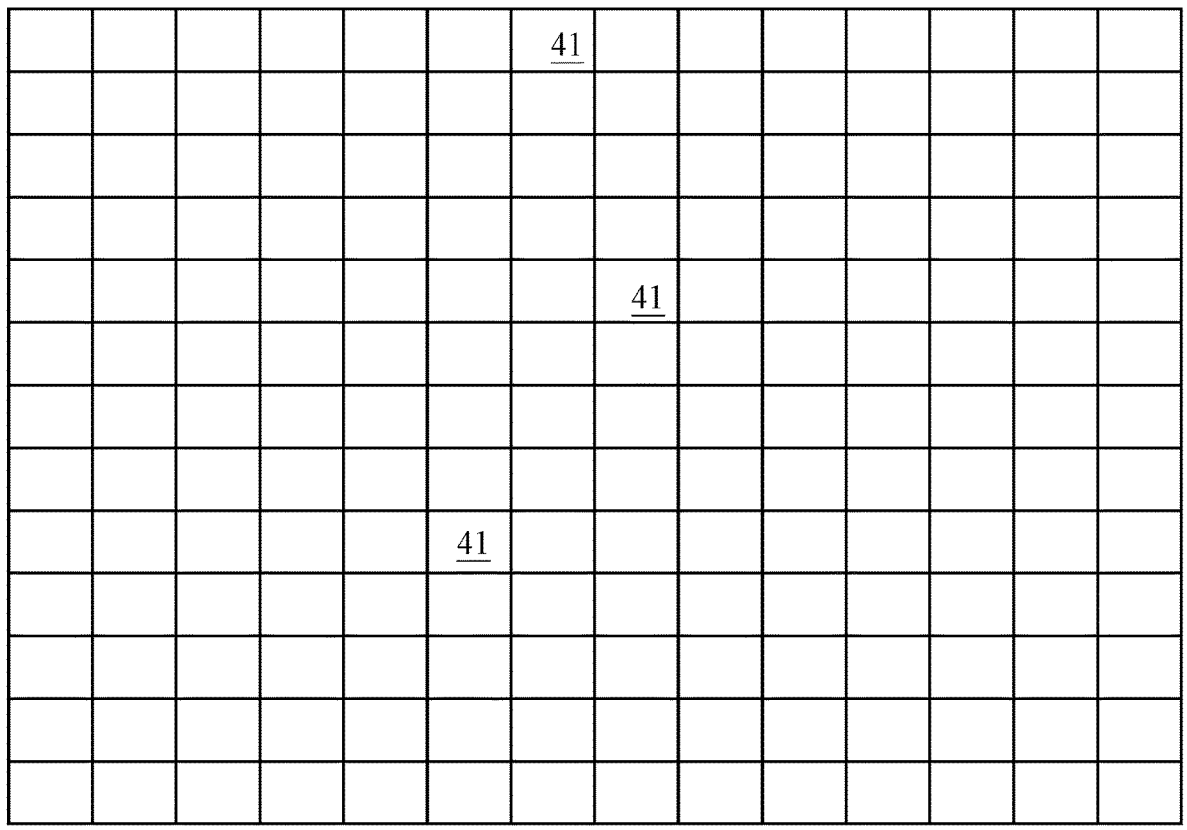
FIG. 2 is a schematic view of divided grids generated by a grid clustering-based system for locating an abnormal area of solder paste printing, according to the present invention.

Particularly, in a condition that the circuit board size information of the circuit board is 700×650 and the grid size information is 50×50, the grid generating module 22 of the analysis device 20 divides the circuit board into 182 divided grids 41 arranged in a 14×13 array; this example is merely for exemplary illustration, and application field of the present invention is not limited thereto. Please refer to FIG. 2, which is a schematic view of the divided grids generated by the grid clustering-based system for locating an abnormal area of solder paste printing, according to the present invention.

After the grid generating module 22 of the analysis device 20 divides the circuit board size information to generate the plurality of divided grids based on the grid size information, the grid designating module 23 of the analysis device 20 designates the location information of at least one bad solder joint as belonging to one of the plurality of generated divided grids; particularly, in a condition that first location information 421 of bad solder joint is (275,75) and a twentieth divided grid 4120 has a grid range in pixel coordinate range between (251,51), (301,51), (251,100) and (301,100), the first location information 421 of (275,75) is within the grid range of the twentieth divided grid 4120, so the grid designating module 23 of the analysis device 20 designates the first location information 421 of bad solder joint as belonging to the twentieth divided grid 4120. This example is merely for exemplary illustration, and application field of the present invention is not limited thereto.

After the grid designating module 23 of the analysis device 20 designates each location information of the bad solder joint as belonging to one of the plurality of generated divided grids, the bad solder joint statistics module 24 of the analysis device 20 compiles statistics of a total number of at least one bad solder joint belonged to each divided grid. Particularly, when 20 pieces of location information of bad solder joint are designated as belonging to the twentieth divided grid 4120, the bad solder joint statistics module 24 of the analysis device 20 determines that the total number of bad solder joints belonged to the twentieth divided grid 4120 is 20; when 35 pieces of location information of bad solder joint are designated as belonging to the thirty-fourth divided grid 4134, the bad solder joint statistics module 24 of the analysis device 20 determines that the total number of bad solder joints belonged to the thirty-fourth divided grid 4134 is 35; when 23 pieces of location information of bad solder joint are designated as belonging to the thirty-fifth divided grid 4135, the bad solder joint statistics module 24 of the analysis device 20 determines that the total number of bad solder joints belonged to the thirty-fifth divided grid 4135 is 23. These examples are merely for exemplary illustration, and application field of the present invention is not limited thereto.

After the bad solder joint statistics module 24 of the analysis device 20 compiles statistics of the total number of bad solder joints belonged to each divided grid, when the total number of bad solder joints of one of divided grids is determined to be higher than or equal to a density threshold value, the grid setting module sets the one of the divided grids as a high dense grid. It should be noted that the analysis device 20 can pre-store the density threshold value or the analysis device 20 can receive the density threshold value from an external device through a wired transmission manner or a wireless transmission manner. These examples are merely for exemplary illustration, and application field of the present invention is not limited thereto.

Figure 3:
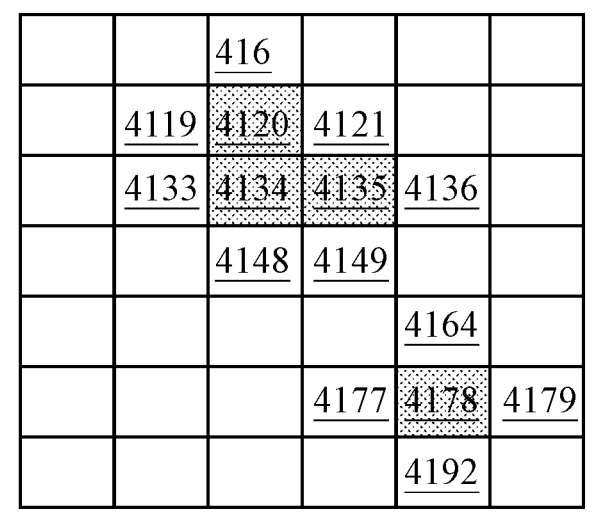

Particularly, in a condition that the density threshold value is 15, when the total number of bad solder joints, which are belonged to the twentieth divided grid 4120, is 20 being greater than the density threshold value of 15, the grid setting module 25 of the analysis device 20 sets the twentieth divided grid 4120 as a high dense grid; when the total number of bad solder joints, which are belonged to the thirty-fourth divided grid 4134, is 35 being greater than the density threshold value of 15, the grid setting module 25 of the analysis device 20 can set the thirty-fourth divided grid 4134 as a high dense grid; when the total number of bad solder joints, which are belonged to the thirty-fifth divided grid 4135, is 23 being greater than the density threshold value of 15, the grid setting module 25 of the analysis device 20 can set the thirty-fifth divided grid 4135 as a high dense grid; when the total number of bad solder joints, which are belonged to the seventy-eighth divided grid 4178, is 30 being greater than the density threshold value of 15, the grid setting module 25 of the analysis device 20 can set the seventy-eighth divided grid 4178 as a high dense grid. Please refer to FIG. 3, which is a schematic view of high dense grids generated by the grid clustering-based system for locating an abnormal area of solder paste printing, according to the present invention. In FIG. 3, each high dense grid is schematically presented as a grid filled with dots, but the present disclosure is not limited thereto: for example, the high dense grid can be schematically presented as a grid filled with different color or oblique lines. FIG. 3 just shows a portion of divided grids of FIG. 2.

After the grid setting module 25 of the analysis device 20 sets the divided grid, which has the total number of bad solder joints higher than or equal to the density threshold value, as the high dense grid, the area integrating module 26 of the analysis device 20 determines whether any one of the divided grids adjacent to each high dense grid is also a high dense grid, and then integrates the high dense grids adjacent to each other as a high-dense bad solder joint areas based on the minimum description length principle, so as to find all high dense areas of bad solder joints.

Figure 4:
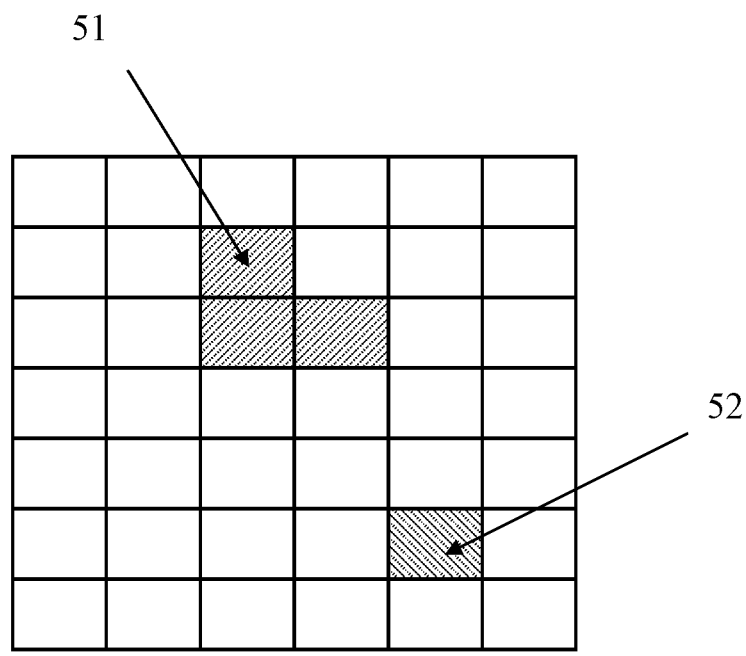
FIG. 4 is a schematic view of high dense areas of bad solder joint generated by a grid clustering-based system for locating an abnormal area of solder paste printing, according to the present invention.

Please refer to FIGS. 3 and 4. FIG. 4 is a schematic view of high dense areas of bad solder joints generated by the grid clustering-based system for locating an abnormal area of solder paste printing, according to the present invention.

As shown in FIG. 4, the area integrating module 26 of the analysis device 20 determines that the divided grids adjacent to the twentieth divided grid 4120 include a sixth divided grid 416, a nineteenth divided grid 4119, a twenty-first divided grid 4121 and a thirty-fourth divided grid 4134, and the thirty-fourth divided grid 4134 is a high dense grid: the area integrating module 26 determines that the divided grids adjacent to the thirty-fourth divided grid 4134 include a twentieth divided grid 4120, a thirty-third divided grid 4133, a thirty-fifth divided grid 4135 and a forty-eighth divided grid 4148, and the twentieth divided grids 4120 and the thirty-fifth divided grid 4135 are high dense grids: the area integrating module 26 determines that the divided grids adjacent to the thirty-fifth divided grid 4135 include a twenty-first divided grid 4121, a thirty-fourth divided grid 4134, a thirty-sixth divided grid 4136 and a forty-ninth divided grid 4149, and the thirty-fourth divided grid 4134 is a high dense grid; the area integrating module 26 determines that the divided grids adjacent to the seventy-eighth divided grid 4178 include a sixty-fourth divided grid 4164, a seventy-seventh divided grid 4177, a seventy-ninth divided grid 4179 and a ninety-second divided grid 4192, and none of the divided grids is a high dense grid.

The area integrating module 26 of the analysis device 20 integrates the adjacent high dense grids including the twentieth divided grid 4120, the thirty-fourth divided grid 4134 and the thirty-fifth divided grid 4135, as a first high-dense bad solder joint area 51 based on the minimum description length principle; the area integrating module 26 of the analysis device 20 integrates the high dense grid including the seventy-eighth divided grid 4178 as a second high-dense bad solder joint area 52 based on the minimum description length principle. Therefore, the area integrating module 26 of the analysis device 20 can find all high-dense bad solder joint areas including the first high-dense bad solder joint area 51 and the second high-dense bad solder joint area 52. FIG. 4 schematically shows the first high-dense bad solder joint area 51 and the second high-dense bad solder joint area 52 which are schematically presented as grids with oblique lines, and the first high-dense bad solder joint area 51 and the second high-dense bad solder joint area 52 are differentiated by oblique lines with different directions, but the present disclosure is not limited thereto: for example, the first high-dense bad solder joint area 51 and the second high-dense bad solder joint area 52 can be schematically presented as divided grids with different colors or dots. FIG. 4 just shows a portion of divided grids of FIG. 2.

Figure 5:
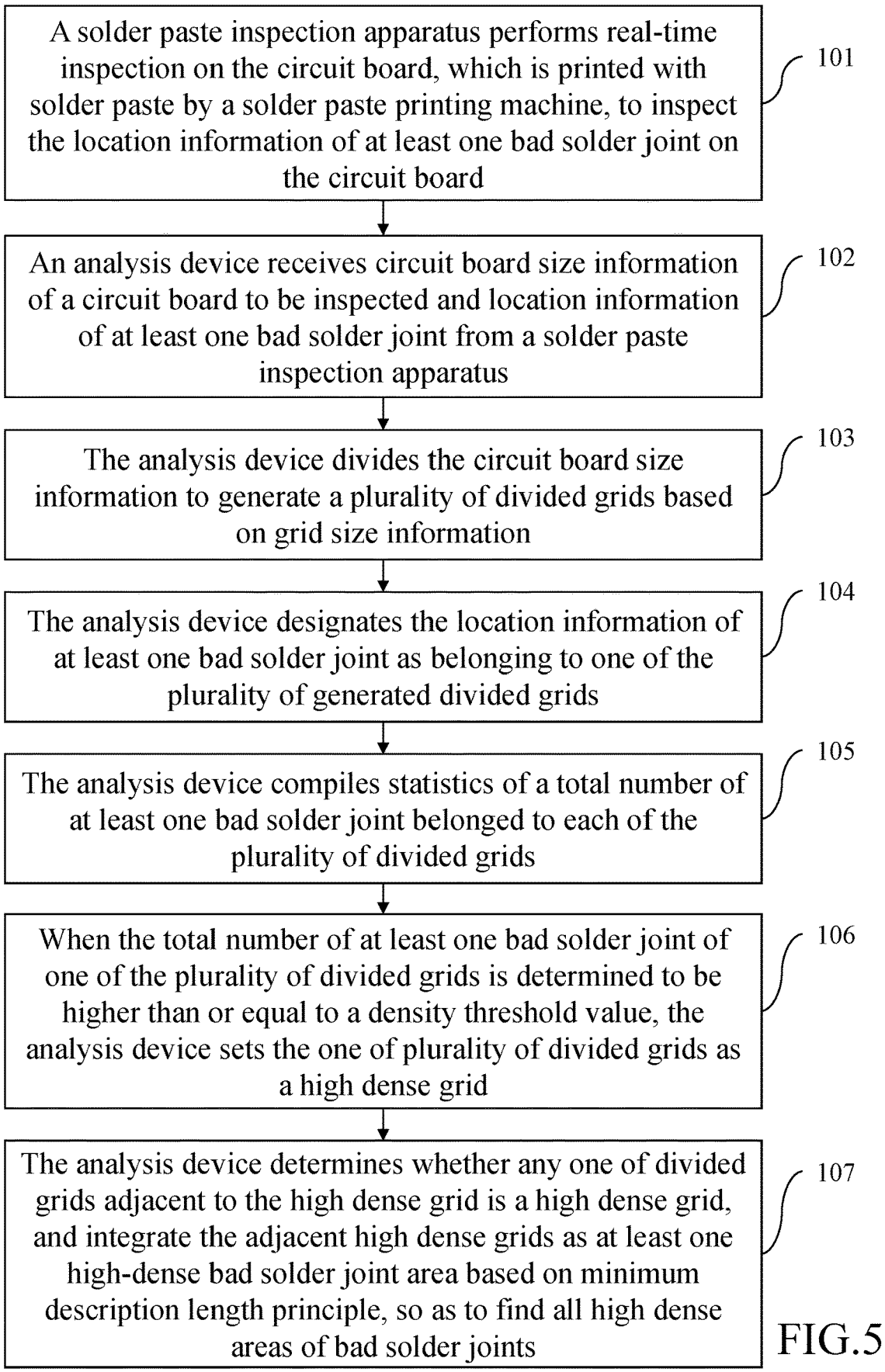
FIG. 5 is a flowchart of a grid clustering-based method for locating an abnormal area of solder paste printing, according to the present invention.

The operational method of the present invention will be described with reference to FIG. 5. As shown in FIG. 5, which is a flowchart of a grid clustering-based method for locating an abnormal area of solder paste printing, according to the present invention.

In a step 101, the solder paste inspection apparatus performs real-time inspection on the circuit board, which is printed with solder paste by a solder paste printing machine, to inspect the location information of at least one bad solder joint on the circuit board. In a step 102, the analysis device receives the circuit board size information of the circuit board to be inspected and the location information of at least one bad solder joint from the solder paste inspection apparatus. In a step 103, the analysis device divides the circuit board size information to generate the divided grids based on the grid size information. Next, in a step 104, the analysis device designates the location information of at least one bad solder joint as belonging to one of the divided grids. In a step 105, the analysis device compiles statistics of the total number of bad solder joints belonged to each of the divided grids. In a step 106, when the total number of bad solder joints of one of the divided grids is determined to be higher than or equal to the density threshold value, the analysis device sets the one of the divided grids as the high dense grid. In a step 107, the analysis device determines whether any one of the divided grids adjacent to each high dense grid is the high dense grid, and then integrate the adjacent high dense grids as at least one high-dense bad solder joint area based on the minimum description length principle, so as to find all high-dense bad solder joint areas.

Therefore, difference between the present invention and the conventional technology is that the analysis device divides the circuit board size information to generate the divided grids based on the grid size information, and when the total number of bad solder joints of one of the divided grids is determined to be higher than or equal to the density threshold value, the analysis device sets the one of the divided grids as a high dense grid, and then integrates the divided grids, which are high dense grids and interconnected to each other, as a high-dense bad solder joint areas, so as to provide the quick and intuitive effect of locating the bad solder joints.

Therefore, the technical solution of the present invention is able to solve the conventional technical problem that the conventional inspection for bad solder joint of the circuit board inspects bad solder joint only and is unable to integrally analyze area of bad solder joints, so that the technical effect of integrating high-dense bad solder joint area to locate the bad solder joint can be achieved.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A grid clustering-based system for locating abnormal area of solder paste printing, comprising:
    an analysis device, comprising:
        a receiving module configured to receive circuit board size information of a circuit board to be inspected and location information of at least one bad solder joint from a solder paste inspection apparatus;
        a grid generating module configured to divide the circuit board size information to generate a plurality of divided grids based on the grid size information;
        a grid designating module configured to designate the location information of at least one bad solder joint as belonging to one of the plurality of generated divided grids;
        a bad solder joint statistics module configured to compile statistics of a total number of the at least one bad solder joint belonged to each of the plurality of divided grids;
        a grid setting module, wherein when the total number of the at least one bad solder joints of one of the plurality of divided grids is determined to be higher than or equal to a density threshold value, the grid setting module sets the one of the plurality of divided grids as a high dense grid; and
        an area integrating module configured to determine whether any one of the divided grids adjacent to the high dense grid is a high dense grid, integrate the adjacent high dense grids as at least one high-dense bad solder joint area based on a minimum description length principle, so as to find all high dense areas of bad solder joints.

2. The grid clustering-based system for locating abnormal area of solder paste printing according to claim 1, wherein the solder paste inspection apparatus imports basic information related to the circuit board to be inspected, the basic information comprises the circuit board size information of the circuit board to be inspected, the solder paste inspection apparatus performs real-time inspection on the circuit board, which is printed with solder paste at particular locations by a solder paste printing machine, to inspect the location information of at least one bad solder joint on the circuit board.

3. The grid clustering-based system for locating abnormal area of solder paste printing according to claim 1, wherein when the solder paste inspection apparatus performs real-time inspection on the circuit board, the solder paste inspection apparatus obtains the circuit board size information of the circuit board by an image recognition manner.

4. The grid clustering-based system for locating abnormal area of solder paste printing according to claim 1, wherein the grid generating module divides the circuit board size information to generate the plurality of divided grids based on grid size information, the divided grids are divided with pixel coordinates, each of the plurality of divided grids is in a rectangular shape, and the grid size information comprises a length dimension and a width dimension with the same values or different values.

5. The grid clustering-based system for locating abnormal area of solder paste printing according to claim 1, wherein the analysis device pre-stores the density threshold value or the analysis device receives the density threshold value from an external device by a wired transmission manner or a wireless transmission manner.

6. A grid clustering-based method for locating abnormal area of solder paste printing, comprising:
using an analysis device to receive circuit board size information of a circuit board to be inspected and location information of at least one bad solder joint from a solder paste inspection apparatus;
using the analysis device to divide the circuit board size information to generate a plurality of divided grids based on grid size information;
using the analysis device to designate the location information of at least one bad solder joint as belonging to one of the plurality of generated divided grids;
using the analysis device to compile statistics of a total number of at least one bad solder joint belonged to each of the plurality of divided grids;
when the total number of at least one bad solder joint of one of the plurality of divided grids is determined to be higher than or equal to a density threshold value, using the analysis device to set the one of plurality of divided grids as a high dense grid; and
using the analysis device to determine whether any one of divided grids adjacent to the high dense grid is a high dense grid, and integrate the adjacent high dense grids as at least one high-dense bad solder joint area based on minimum description length principle, so as to find all high dense areas of bad solder joints.

7. The grid clustering-based method for locating abnormal area of solder paste printing according to claim 6, wherein the solder paste inspection apparatus imports basic information related to the circuit board, the basic information comprises the circuit board size information of the circuit board, the solder paste inspection apparatus performs real-time inspection on the circuit board which is printed with solder paste at particular locations by a solder paste printing machine, to inspect location information of at least one bad solder joint on the circuit board.

8. The grid clustering-based method for locating abnormal area of solder paste printing according to claim 6, wherein when the solder paste inspection apparatus performs real-time inspection on the circuit board, the solder paste inspection apparatus obtains the circuit board size information of the circuit board by an image recognition manner.

9. The grid clustering-based method for locating abnormal area of solder paste printing according to claim 6, wherein in the step of using the analysis device to divide the circuit board size information to generate the plurality of divided grids based on the grid size information, the divided grids are divided with pixel coordinates, and each of the plurality of divided grids is in a rectangular shape, and the grid size information comprises a length dimension and a width dimension with the same values or different values.

10. The grid clustering-based method for locating abnormal area of solder paste printing according to claim 6, wherein the analysis device pre-stores the density threshold value or the analysis device receives the density threshold value from an external device by a wired transmission manner or a wireless transmission manner.

* * * * *